(12) United States Patent
Takai

(10) Patent No.: US 7,355,408 B2
(45) Date of Patent: Apr. 8, 2008

(54) MAGNETIC RESONANCE IMAGING APPARATUS AND METHOD OF JUDGING PRESENCE OR ABSENCE OF RESONANCE IN MAGNETIC RESONANCE IMAGING APPARATUS

(75) Inventor: Hiroshi Takai, Nasu-gun (JP)

(73) Assignees: Kabushiki Kaisha Toshiba, Tokyo (JP); Toshiba Medical Systems Corporation, Tochigi (JP)

(*) Notice: Subject to any disclaimer, the term of this patent is extended or adjusted under 35 U.S.C. 154(b) by 0 days.

(21) Appl. No.: 11/175,368

(22) Filed: Jul. 7, 2005

(65) Prior Publication Data

US 2005/0270030 A1 Dec. 8, 2005

Related U.S. Application Data

(63) Continuation of application No. PCT/JP2005/005002, filed on Mar. 18, 2005.

(30) Foreign Application Priority Data

Mar. 24, 2004 (JP) .............................. 2004-087597

(51) Int. Cl.
*G01V 3/00* (2006.01)
(52) U.S. Cl. ............................................. 324/318
(58) Field of Classification Search ......... 324/300–322
See application file for complete search history.

(56) References Cited

U.S. PATENT DOCUMENTS

| 5,786,693 | A  | * | 7/1998  | Gullapalli et al. .......... 324/309 |
| 6,492,816 | B1 | * | 12/2002 | Feenan ....................... 324/318 |
| 6,567,685 | B2 | * | 5/2003  | Takamori et al. ........... 600/410 |
| 2003/0139660 | A1 | * | 7/2003 | Tatebayashi et al. ........ 600/407 |
| 2003/0206015 | A1 |   | 11/2003 | Feiweier |

FOREIGN PATENT DOCUMENTS

| JP | 1-303140 | 12/1989 |
| JP | 4-208134 | 7/1992 |
| JP | 7-210256 | 8/1995 |
| JP | 8-257008 | 10/1996 |

OTHER PUBLICATIONS

Hedeen et al.; "Characterization and prediction of gradient acoustic noise in MR imagers"; 1997, PubMed.gov; Abstract.*

(Continued)

*Primary Examiner*—Brij Shrivastav
*Assistant Examiner*—Dixomara Vargas
(74) *Attorney, Agent, or Firm*—Nixon & Vanderhye, P.C.

(57) ABSTRACT

A magnetic resonance imaging apparatus has a gradient magnetic unit that generates a gradient magnetic field, an obtention unit that obtains an oscillation characteristic of the magnetic resonance imaging apparatus according to a change of the gradient magnetic field caused by imaging plural slices and a judgment unit that judges whether sympathetic vibration occurs based on the obtained oscillation characteristic.

21 Claims, 8 Drawing Sheets

OTHER PUBLICATIONS

European Search Report dated Mar. 20, 2006.

Tomasi et al., "Echo Planar Imaging at 4 Tesla With Minimum Acoustic Noise", Journal of Magnetic Resonance Imaging, vol. 18, 2003, pp. 128-130, SP002370058.

Hennel et al., Silent MRI with Soft Gradient Pulses:, Magnetic Resonance in Medicine, Academic Press, Duluth, MN, US, vol. 42, No. 1, Jul. 1999, pp. 6-10, XP000845914.

Ravicz, "Acoustic Noise During Functional Magnetic Resonance Imaging", Journal of the Acoustical Society of America, AIP/Acoustical Society of America, Melville, NY, US, vol. 108, No. 4, Oct. 2000, pp. 1683-1696, XP012001945.

Skare et al., "An Incubator and "Quiet" Pulse Sequences for MRI Examination of Premature Neonates", Proc. Intl. Soc. Mag. Reson. Med. 4, 1996, p. 1727, XP002370059.

Zwart et al, "Reduction of Gradient Acoustic Noise in MRI Using Sense-EPI", Neuroimage, vol. 16, 2002, pp. 1151-1155, XP002370060.

PCT International Preliminary Report on Patentability dated Dec. 5, 2006.

International Search Report - Apr. 7, 2005.

* cited by examiner

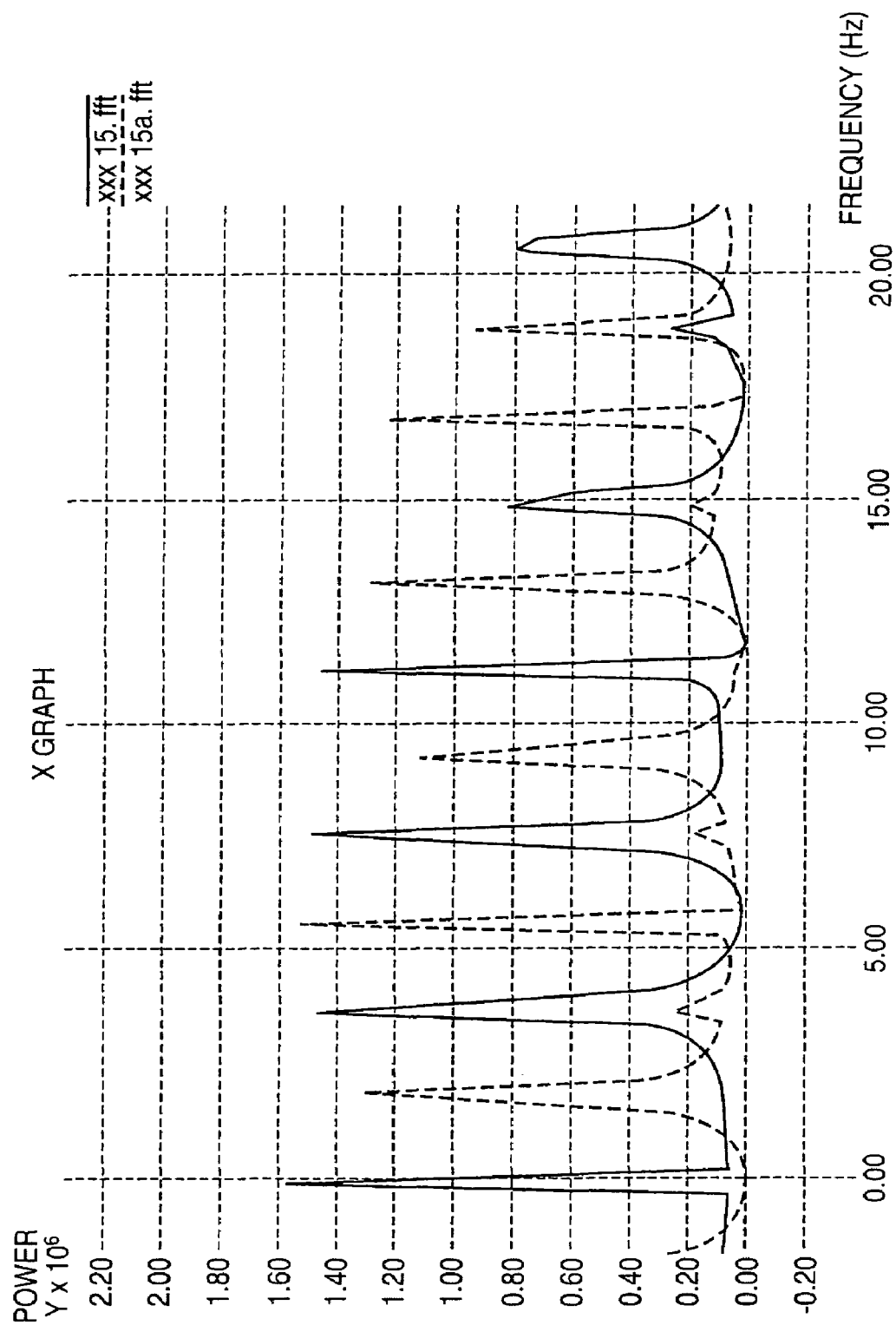

MAGNETIC RESONANCE IMAGING APPARATUS AND METHOD OF JUDGING PRESENCE OR ABSENCE OF RESONANCE IN MAGNETIC RESONANCE IMAGING APPARATUS

CROSS REFERENCE TO RELATED APPLICATIONS

This application is a Continuation of International Application No. PCT/JP2005/005002, filed 18 Mar. 2005, which claims priority of Japanese Application No. 2004-087597, filed 24 Mar. 2004. The entire contents of each of these applications are incorporated herein by reference.

This application is based upon and claims the benefit of priority from prior Japanese Patent Application No. 2004-087597, filed Mar. 24, 2004, the entire contents of which are incorporated herein by reference.

BACKGROUND OF THE INVENTION

1. Field of the Invention

The present invention relates to a magnetic resonance imaging (MRI) apparatus, which generates a magnetic resonance image using the magnetic resonance phenomenon, and a method of judging presence or absence of unwanted mechanical resonance in this magnetic resonance imaging apparatus.

2. Description of the Related Art

A magnetic resonance imaging apparatus is an apparatus that visualizes chemical and physical microscopic information of a substance or observes chemical shift spectra utilizing a phenomenon in which, when a group of nuclei including peculiar magnetic moments are placed in a uniform static magnetic field, the group of nuclei resonantly absorb energy of a radiofrequency magnetic field rotating at a specific frequency.

Imaging of a diagnostic image by this magnetic resonance imaging apparatus is executed, for example, as described below. A patient is arranged in a composite magnetic field that consists of a static magnetic field formed by a magnet and a gradient magnetic field formed by a gradient magnetic field coil. A predetermined Larmor RF frequency for generating the magnetic resonance phenomenon is applied to the patient set in this way. A magnetic resonance signal is generated in the patient by the applied RF signal. The magnetic resonance imaging apparatus receives this magnetic resonance signal with a radiofrequency coil for reception and visualizes the magnetic resonance signal.

In the magnetic resonance imaging apparatus, since the gradient magnetic field changes within the static magnetic field while collecting data, a dynamic load due to the Lorentz force is applied to the gradient magnetic field coil structures. A dynamic load is also applied to the static magnetic field structures because of electromagnetic induction or propagation due to mechanical combination with the gradient magnetic field coil. When a frequency of this imposed mechanical load approaches a natural resonant frequency of a support system of the gradient magnetic field or a natural resonant frequency of the magnet, wherein resonance is caused. When resonance starts to occur, the amplitude of mechanical motion oscillation increase, which causes image blur or deterioration in image quality due to signal deterioration in a sequence for forming an image using plural echoes such as an FSE (Fast Spin Echo) method. Other than the influence on image quality, there are also deficiencies such as an unpleasant feeling given to a patient.

Note that a technique for reducing noise caused following a change in a gradient magnetic field waveform is known through, for example, JP-A-4-208134. In JP-A-4-208134, intensity and application time of a read pulse are set in predetermined ranges, a spectrum of the set read pulse is estimated, and power of noise caused by the read pulse is estimated from a measured noise characteristic. There is disclosed a technique for controlling noise in a sequence for switching a read pulse at high speed such as EPI (Echo Planar Imaging) by estimating a read pulse at which the estimated power of noise is minimized. According to the disclosure of JP-A-4-208134, since a response function spectrum of noise has plural peaks (modes of resonance), it is possible to reduce a noise level by shifting a basic frequency or the like of the read pulse sequence from the peaks appropriately.

However, in JP-A-4-208134, since attention is only paid to spectrum for one slice period, the measured noise concerns only oscillation of a relatively high frequency. Thus, it is likely that prior noise controlling effects are insufficient to avoid other imaging problems as noted above.

As described above, conventionally, resonance of a natural oscillation following a dynamic load occurs to deteriorate image quality and cause deficiencies such as an unpleasant feeling given to a patient.

BRIEF SUMMARY

The exemplary embodiment of this invention has been devised taking into account such circumstances to provide a magnetic resonance imaging apparatus that can reduce sympathetic mechanical vibration oscillations following a dynamic load.

According to one aspect the following exemplary magnetic resonance imaging apparatus may include a gradient magnetic unit that generates a gradient magnetic field, an obtention unit that obtains an oscillation characteristic of an magnetic resonance imaging apparatus according to a change of the gradient magnetic field caused by imaging plural slices and a judgment unit that judges whether sympathetic vibration is likely to occurs based on the obtained oscillation characteristic.

It comprises a gradient magnetic unit that generates a gradient magnetic field, an obtention unit that obtains an oscillation characteristic of an magnetic resonance imaging apparatus according to a change of the gradient magnetic field caused by imaging plural slices and a judgment unit that judges whether sympathetic vibration occurs based on the obtained oscillation characteristic.

According to another aspect of the exemplary embodiment, a method of controlling a magnet resonance imaging apparatus may include obtaining an oscillation characteristic of an magnetic resonance imaging apparatus according to a change of a gradient magnetic field caused by imaging plural slices and judging whether sympathetic vibration is likely to occurs based on the obtained oscillation characteristic.

It comprises a step of obtaining an oscillation characteristic of an magnetic resonance imaging apparatus according to a change of a gradient magnetic field caused by imaging plural slices and a step of judging whether sympathetic vibration occurs based on the obtained oscillation characteristic.

BRIEF DESCRIPTION OF THE SEVERAL VIEWS OF THE DRAWING

FIG. 8 is a graph showing a change in a frequency characteristic of an input power spectrum concerning the X-axis direction in the pulse sequences shown in FIGS. 5 and 7.

DETAILED DESCRIPTION OF EXEMPLARY EMBODIMENTS

An exemplary embodiment will be hereinafter explained with reference to the drawings.

Figure 1:
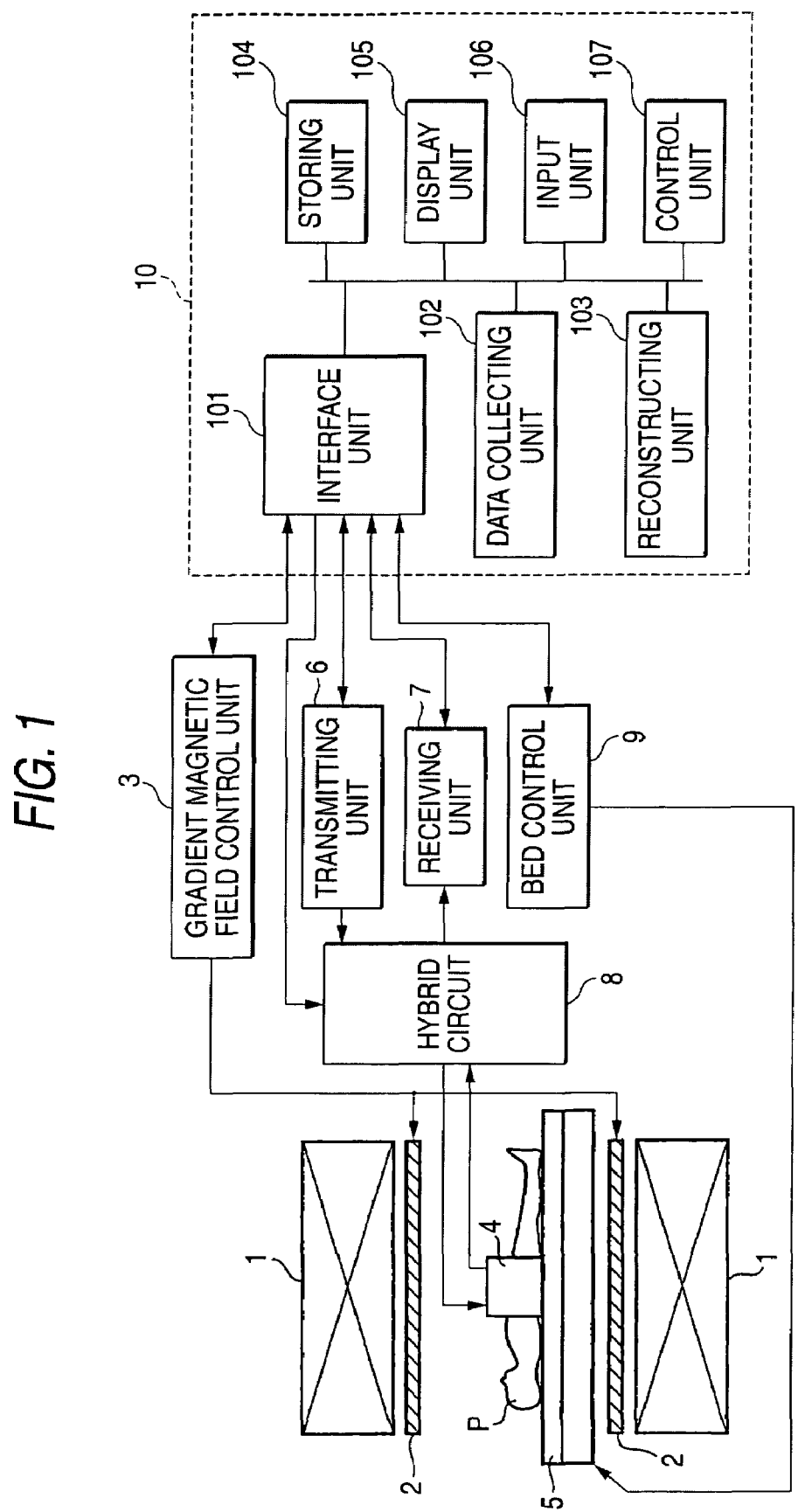
FIG. 1 is a diagram showing a structure of a magnetic resonance imaging apparatus according to an exemplary embodiment of the invention.

FIG. 1 is a diagram showing a structure of a magnetic resonance imaging apparatus according to this embodiment. This magnetic resonance imaging apparatus shown in FIG. 1 includes a static magnetic field magnet 1, a gradient magnetic field coil 2, a gradient magnetic field control unit 3, a radiofrequency coil 4, a bed 5, a transmitting unit 6, a receiving unit 7, a hybrid circuit 8, a bed control unit 9, and a computer system 10.

The static magnetic field magnet 1 is formed in a hollow cylindrical shape and generates a uniform static magnetic field in an inside space. As this static magnetic field magnet 1, for example, a permanent magnet or a superconducting magnet is used.

The gradient magnetic field coil 2 is formed in a hollow cylindrical shape and arranged inside the static magnetic field magnet 1. In the gradient magnetic field coil 2, three coils corresponding to X, Y, and Z axes orthogonal to one another are combined. In the gradient magnetic field coil 2, the three coils receive supply of electric currents from the gradient magnetic field control unit 3 separately and generate gradient magnetic fields whose magnetic field intensities are inclined along the respective X, Y, and Z axes. Note that a Z-axis direction is assumed to be, for example, the same direction as the static magnetic field. The gradient magnetic fields of the X, Y, Z axes correspond to, for example, a gradient magnetic field for slice selection Gs, a gradient magnetic field for phase encode Ge, and a gradient magnetic field for readout Gr, respectively. The gradient magnetic field for slice selection Gs determines an imaging section arbitrarily. The gradient magnetic field for phase encode Ge encodes a phase of a magnetic resonance signal according to a spatial position. The gradient magnetic field for readout Gr encodes a frequency of a magnetic resonance signal according to a spatial position.

The gradient magnetic field control unit 3 controls the gradient magnetic field for slice selection Gs, the gradient magnetic field for phase encode Ge, and the gradient magnetic field for readout Gr, for example, in a well-known manner in accordance with a sequence set in advance and imaging conditions set by the control unit 107.

The radiofrequency coil 4 receives supply of a radiofrequency pulse from the transmitting unit 6 and generates a radiofrequency magnetic field. In addition, the radiofrequency coil 4 receives a magnetic resonance signal that is radiated from a patient P because of an influence of the radiofrequency magnetic field. The radiofrequency coil 4 includes two radiofrequency coils (not shown).

The bed 5 is a stand for placing the patient P thereon. A top plate forming a part of the bed 5 is slidable in a left-to-right direction in FIG. 1, whereby relative positions of the patient P and the radiofrequency coil 4 are changed.

The transmitting unit 6 has an oscillating section, a phase selecting section, a frequency converting section, an amplitude modulating section, and a radiofrequency power amplifying section (all of which are not shown in the figure). The oscillating section generates a radiofrequency signal of a resonance frequency peculiar to an object atomic nucleus in a static magnetic field. The phase selecting section selects a phase of the radiofrequency signal. The frequency modulating section subjects the radiofrequency signal outputted from the phase selecting section to frequency modulation. The amplitude modulating section subjects the radiofrequency signal outputted from the frequency modulating section to amplitude modulation in accordance with, for example, a sinc function. The radiofrequency power amplifying section amplifies the radiofrequency signal outputted from the amplitude modulating section. As a result of these operations of the respective sections, the transmitting unit 6 sends a radiofrequency pulse corresponding to the Larmor frequency in order to supply the radiofrequency pulse to the radiofrequency coil 4.

The receiving unit 7 has a preamplifier, a phase detector, and an analog-to-digital converter (all of which are not shown in the figure). The receiving unit 7 amplifies a magnetic resonance signal outputted from the hybrid circuit 8. The phase detector detects a phase of a magnetic resonance signal outputted from the preamplifier. The analog-to-digital converter converts a signal outputted from the phase detector into a digital signal.

The hybrid circuit 8 generates radiofrequency pulses in two systems, which are supplied to the two radiofrequency coils of the radiofrequency coil 4, respectively, from the radiofrequency pulse sent from the transmitting unit 6. The hybrid circuit 8 combines magnetic resonance signals, which are outputted from the two radiofrequency coils, respectively, and then sends the combined magnetic resonance signal to the receiving unit 7.

The bed control unit 9 has a movement mechanism section and a movement control section (both of which are not shown in the figure). The movement mechanism section reciprocatingly moves the top plate of the bed 5 in the axial direction of the static magnetic field magnet 1. The movement control section controls the movement mechanism section to move the top plate appropriately according to a command or the like from an operator.

A computer system 10 has an interface unit 101, a data collecting unit 102, a reconstructing unit 103, a storing unit 104, a display unit 105, an input unit 106, and a control unit 107.

The gradient magnetic field control unit 3, the transmitting unit 6, the receiving unit 7, the bed control unit 9, and the like are connected to the interface unit 101. The interface unit 101 inputs and outputs signals that are transmitted and received between these respective units connected to the interface unit 101 and the computer system 10.

The data collecting unit 102 collects digital signals, which are outputted from the receiving unit 7, via the interface unit 101. The data collecting unit 102 stores the collected digital signals, that is, magnetic resonance signal data in the storing unit 104.

The restructuring unit 103 executes post-processing, that is, restructuring such as the Fourier transformation on the magnetic resonance signal data stored in the storing unit 104 and obtains spectrum data or image data of a desired nuclear spin in the patient P.

The storing unit 104 stores the magnetic resonance signal data and the spectrum data or the image data for each patient. The storing unit 104 also stores input spectrum information that is inputted at the time of installation work or the like for this magnetic resonance imaging apparatus.

The display unit 105 displays various kinds of information such as the spectrum data and the image data under the control of the control unit 107. As the display unit 105, it is possible to use a display device such as a liquid crystal display device.

The input unit 106 receives various commands and information inputs from an operator. As the input unit 106, it is possible to use a pointing device such as a mouse or a trackball, a selection device such as a mode changeover switch, or an input device such as a keyboard according to circumstances.

The control unit 107 has a CPU, a memory, and the like that are not shown in the figure and controls the magnetic resonance imaging apparatus in this embodiment collectively. The control unit 107 includes a setting function, an estimation function, and a judgment function other than a control function for realizing well-known operations of the magnetic resonance imaging apparatus. The control unit 107 sets imaging conditions with the setting function. With the estimation function, the control unit 107 estimates frequency characteristics of oscillation for the respective directions of the X, Y, and Z axes of the magnetic resonance imaging apparatus following an operation for imaging under the set imaging conditions. With the judgment function, the control unit 107 judges whether resonance occurs in the magnetic resonance imaging apparatus because of imaging under the imaging conditions.

Next, operations of the magnetic resonance imaging apparatus constituted as described above will be explained. Note that, since an operation for obtaining an image of the patient P is performed as in the past, an explanation of the operation is omitted here. Characteristic operations according to the exemplary embodiment will be hereinafter explained.

First, in order to use this magnetic resonance imaging apparatus, input spectrum information indicating a characteristic of a natural oscillation of the magnetic resonance imaging apparatus along the respective axial directions of X, Y, and Z is stored in the storing unit 104 in advance. The input spectrum information is created by estimating frequency characteristics of oscillation, which depend on a relation between the static magnetic field magnet 1 and the gradient magnetic field coil 2 and the support system therefor, in the respective axial directions of X, Y, and Z in advance and applying filter processing for emphasizing components near a natural frequency to the respective frequency characteristics. It is possible to perform the estimation of frequency characteristics on the basis of an output of an acceleration sensor that is set in an appropriate position of the support mechanism for the static magnetic field magnet 1 and the gradient magnetic field coil 2. Specifically, for example, oscillation (displacement) for each frequency is measured by sweeping a frequency of an input signal to the gradient magnetic field coil 2. Alternatively, an impulse is used as the input signal to the gradient magnetic field coil 2 and a response to the impulse is subjected to the Fourier transformation.

Figure 2:
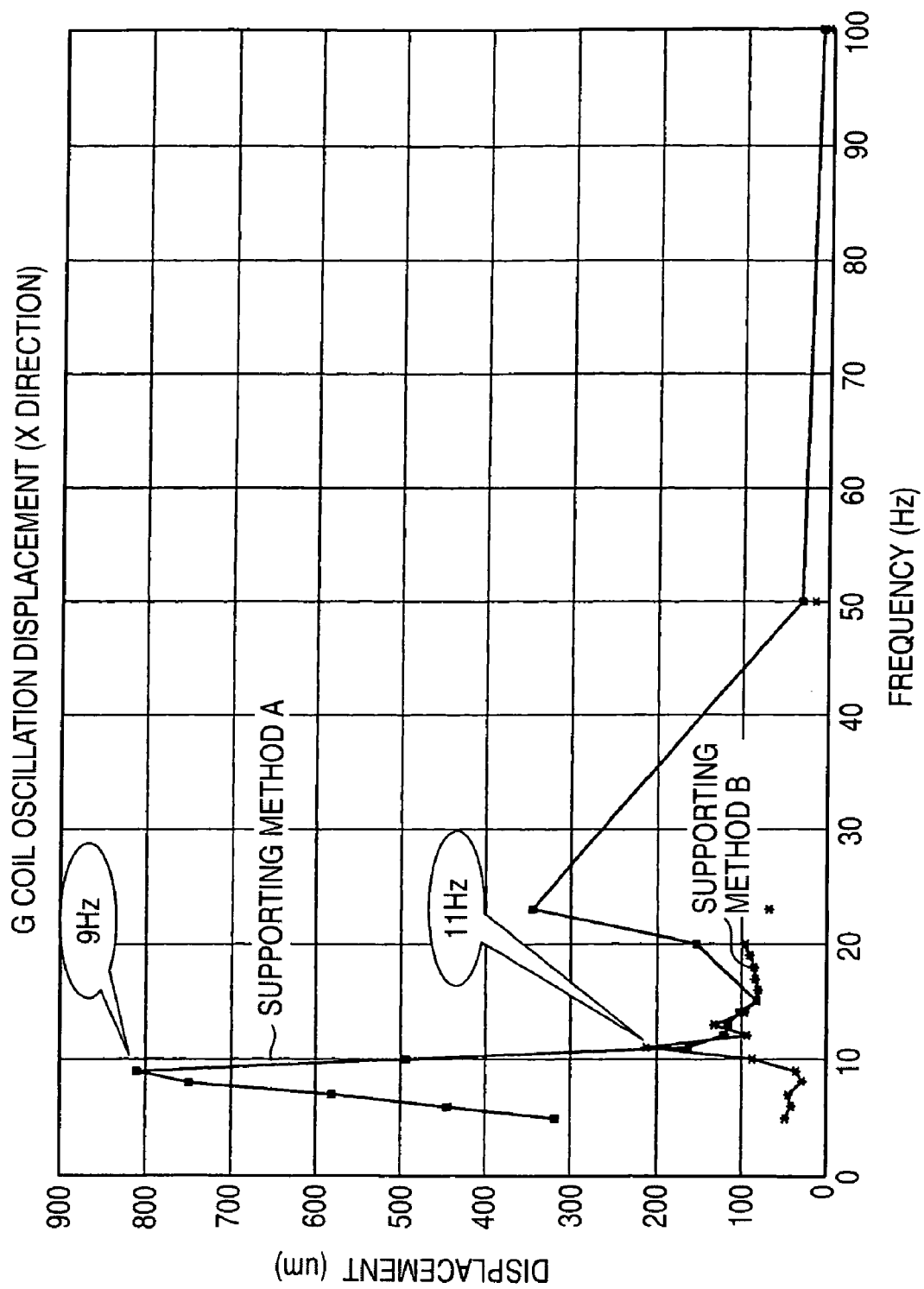
FIG. 2 is a graph showing displacement in an X-axis direction of a gradient magnetic field coil measured by sweeping a frequency of an input signal to the gradient magnetic field coil.
Figure 3:
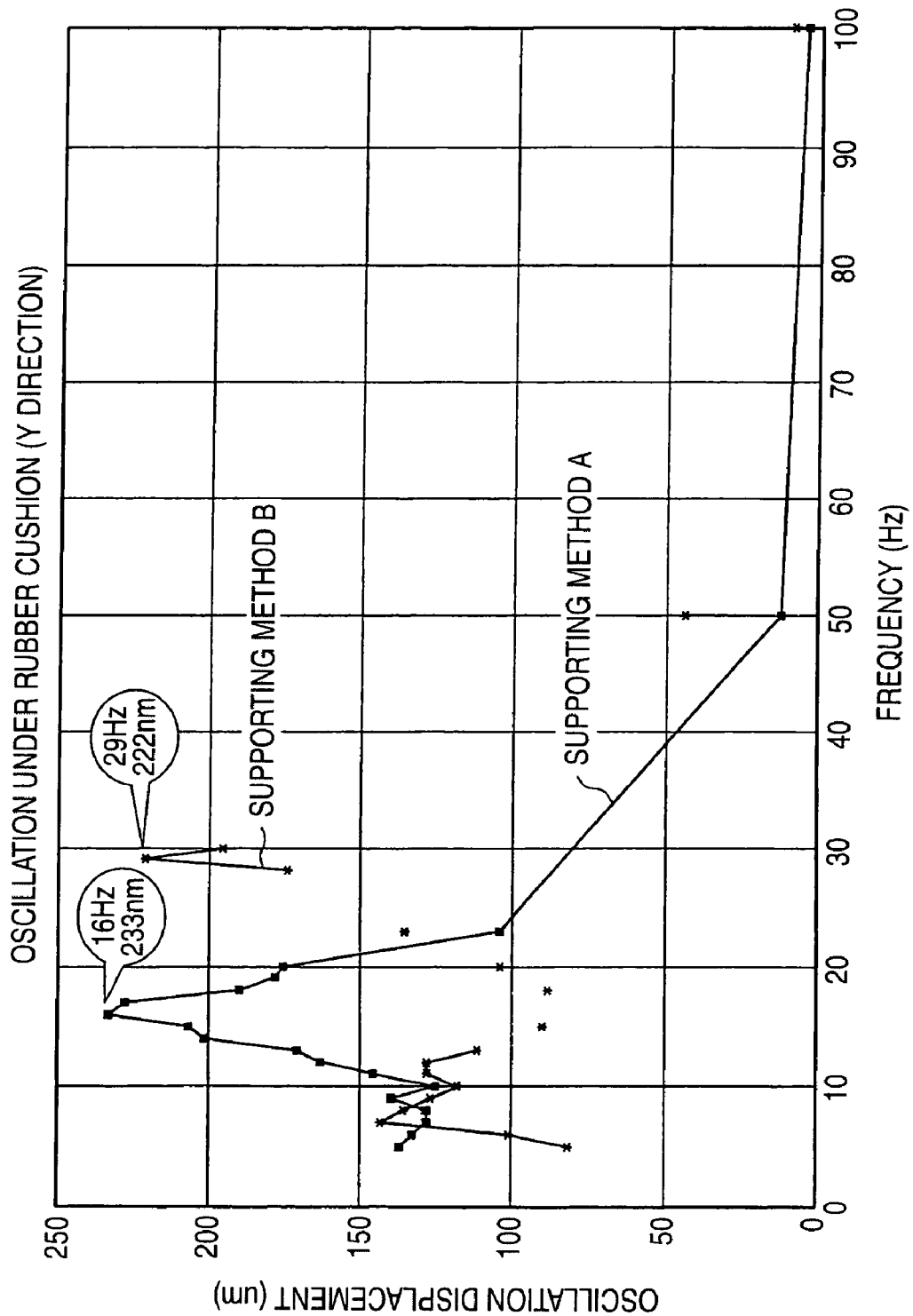
FIG. 3 is a graph showing displacement in a Y-axis direction of a static magnetic field magnet measured by sweeping a frequency of an input signal to a gradient magnetic field coil.

FIG. 2 shows displacement in the X-axis direction of the gradient magnetic field coil 2 measured by sweeping a frequency of an input signal to the gradient magnetic field coil 2. FIG. 3 shows a displacement in the Y-axis direction of the static magnetic field magnet 1 measured by sweeping a frequency of an input signal to the gradient magnetic field coil 2. Both FIGS. 2 and 3 shows states, in which an identical magnetic resonance imaging apparatus is supported by two supporting methods, respectively, in comparison with each other. As shown in FIGS. 2 and 3, even in the identical magnetic resonance imaging apparatus, a natural frequency changes because of a difference of a supporting method. Therefore, it is advisable that, for example, in initial adjustment work after installation of the magnetic resonance imaging apparatus, a worker performs measurement of frequency characteristics, creation of input spectrum information, and input of the input spectrum information.

Figure 4:
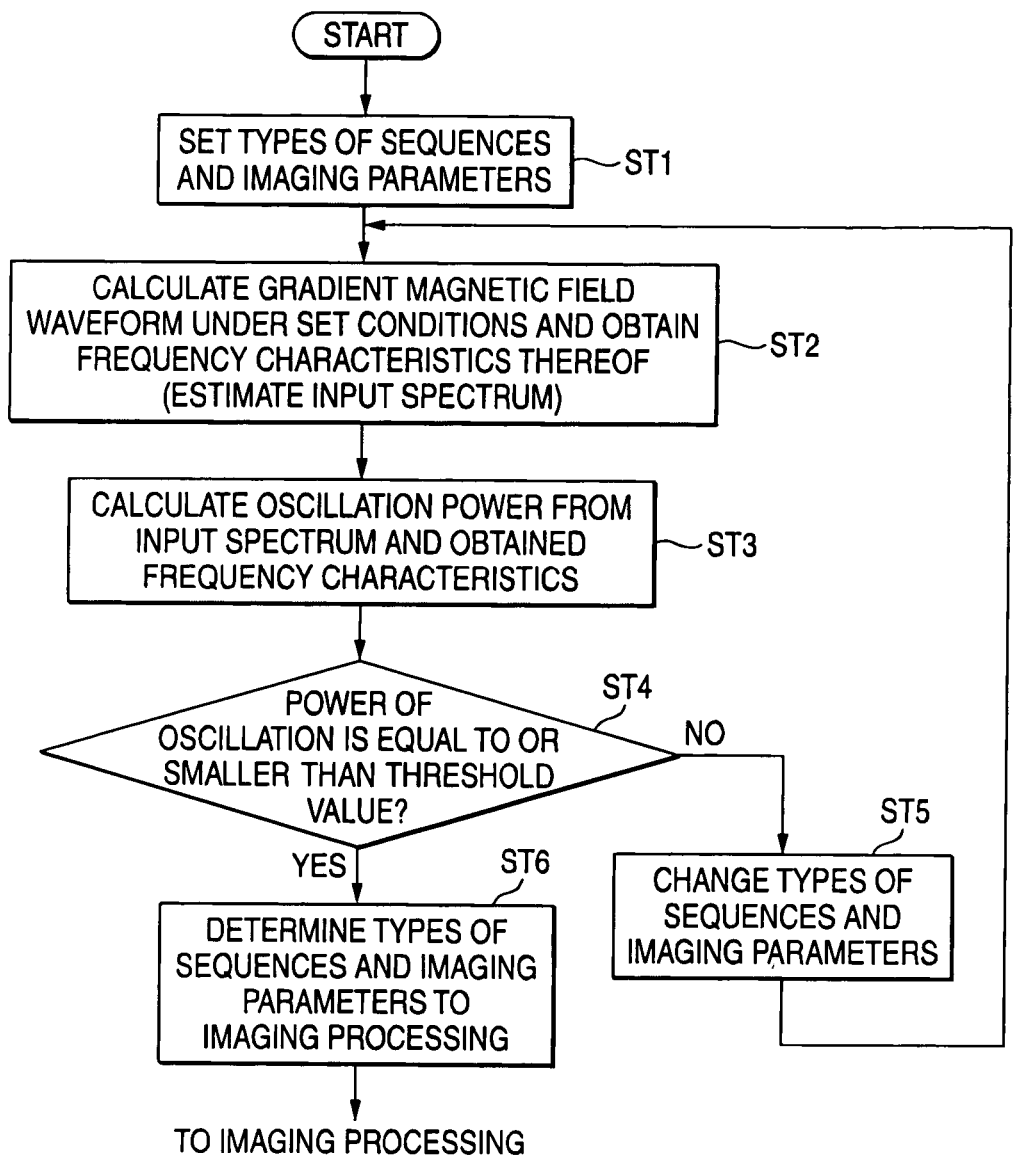
FIG. 4 is a flowchart showing a processing procedure of a control unit at the time when imaging is performed.

Incidentally, when imaging is performed, the control unit 107 executes processing shown in FIG. 4.

In step ST1, with the setting function, the control unit 107 sets imaging conditions (types of sequences used for imaging, imaging parameters, etc.) on the basis of an instruction inputted by an operator using the input unit 106.

In step ST2, with the estimating function, the control unit 107 calculates respective gradient magnetic field waveforms for a gradient magnetic field for slice selection Gs, a gradient magnetic field for phase encode Ge, and a gradient magnetic field for readout Gr required for imaging under the conditions set in step ST1 and obtains frequency characteristics thereof. In other words, the control unit 107 estimates frequency characteristics of gradient magnetic fields concerning the axial directions of X, Y, and Z, respectively.

In step ST3, with the judging function, the control unit 107 calculates oscillation powers in the respective axial directions of X, Y, and Z from the estimated frequency characteristics and an input spectrum indicated by the input spectrum information stored in the storing unit 104.

Incidentally, since the gradient magnetic field coil 2 or the like has a relatively large weight, for example, as it is seen from FIG. 3, a natural frequency thereof takes a relatively small value at 9 to 11 Hz. Considering that harmonics up to five times as high as the frequency affect oscillation of the magnetic resonance imaging apparatus significantly, it is necessary to grasp a characteristic of a frequency as low as 1/5 of the natural frequency (a lowest frequency) in order to calculate the oscillation power. When the natural frequency is assumed to be 9 to 11 Hz, it is necessary to grasp a characteristic of a frequency as low as about 1.8 to 2.2 Hz.

From the sampling theorem, since $f=1/(2t)$ and $t=½f,$ when f=1.8 Hz, t=277 ms and when f=2.2 Hz, t=227 ms.

In other words, when the natural frequency is 9 Hz, it is necessary to calculate frequency characteristics from gradient magnetic field waveforms over 277 ms or more. Although required time is reduced when the natural frequency increases, at least 277 ms is required in the case of 11 Hz. In a general magnetic resonance imaging apparatus, a natural frequency never rises extremely higher than the example described above. Thus, usually, it is necessary to calculate frequency characteristics from gradient magnetic field waveforms over 200 ms or more. On the other hand, one sequence of a pulse sequence for driving the gradient magnetic field coil 2 is completed in a period of one slice. Thus, it is necessary to calculate frequency characteristics on the basis of all gradient magnetic field waveforms for one slice. Since a period of one slice is about one hundred several tens ms no matter how large it is, a gradient magnetic field waveform is insufficient for 200 ms described above. Therefore, in step ST2, frequency characteristics are calculated from gradient magnetic field waveforms for plural slices.

In step ST4, with the judging function, the control unit 107 judges whether oscillation power in any one of the respective axial directions calculated in step ST3 is equal to or higher than a threshold value decided in advance. If it is judged in step ST4 that the oscillation power is larger than the threshold value, the control unit 107 proceeds from step ST4 to step ST5.

Figure 5:
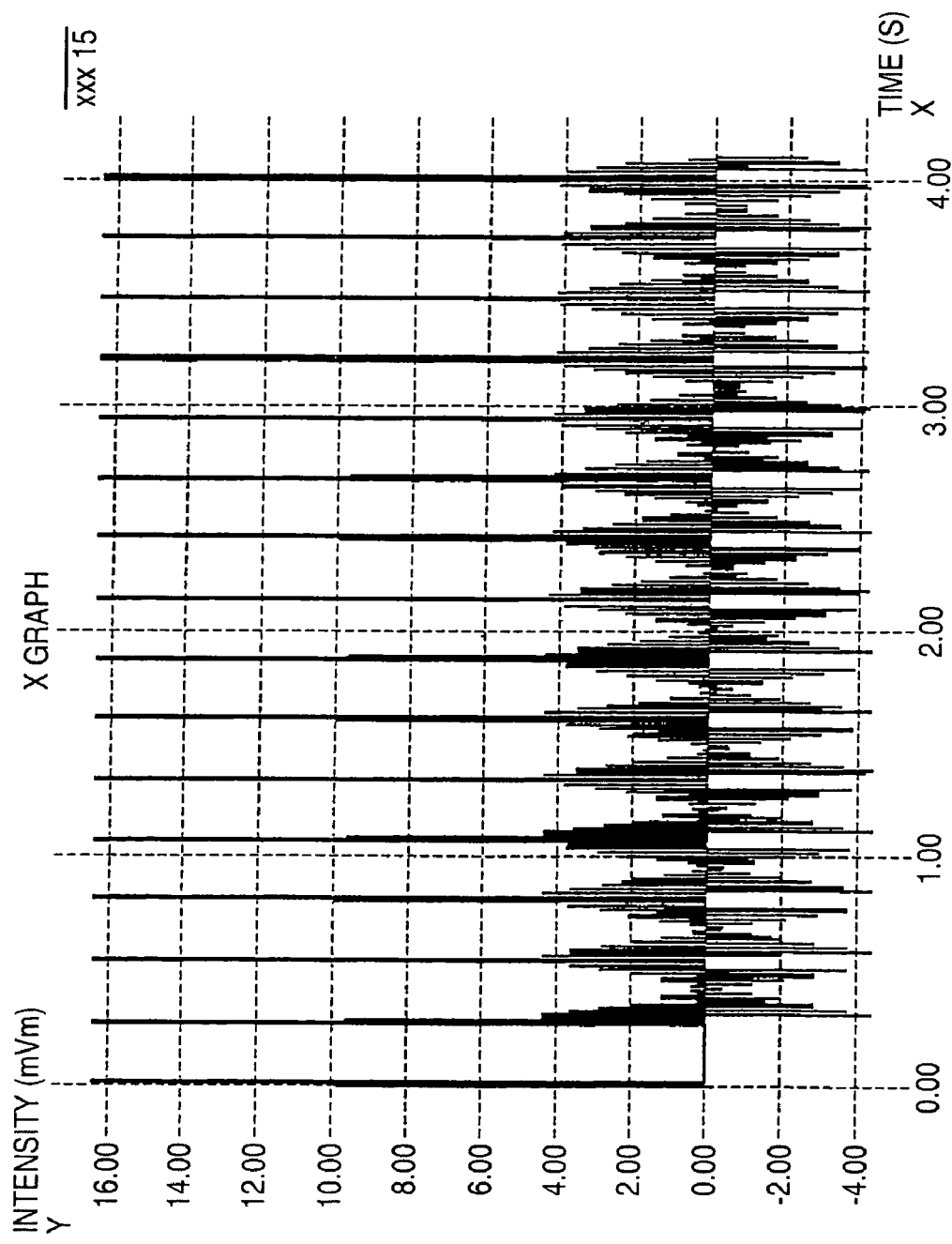
FIG. 5 is a graph showing an example of a pulse sequence for controlling a gradient magnetic field in the X-axis direction.
Figure 6:
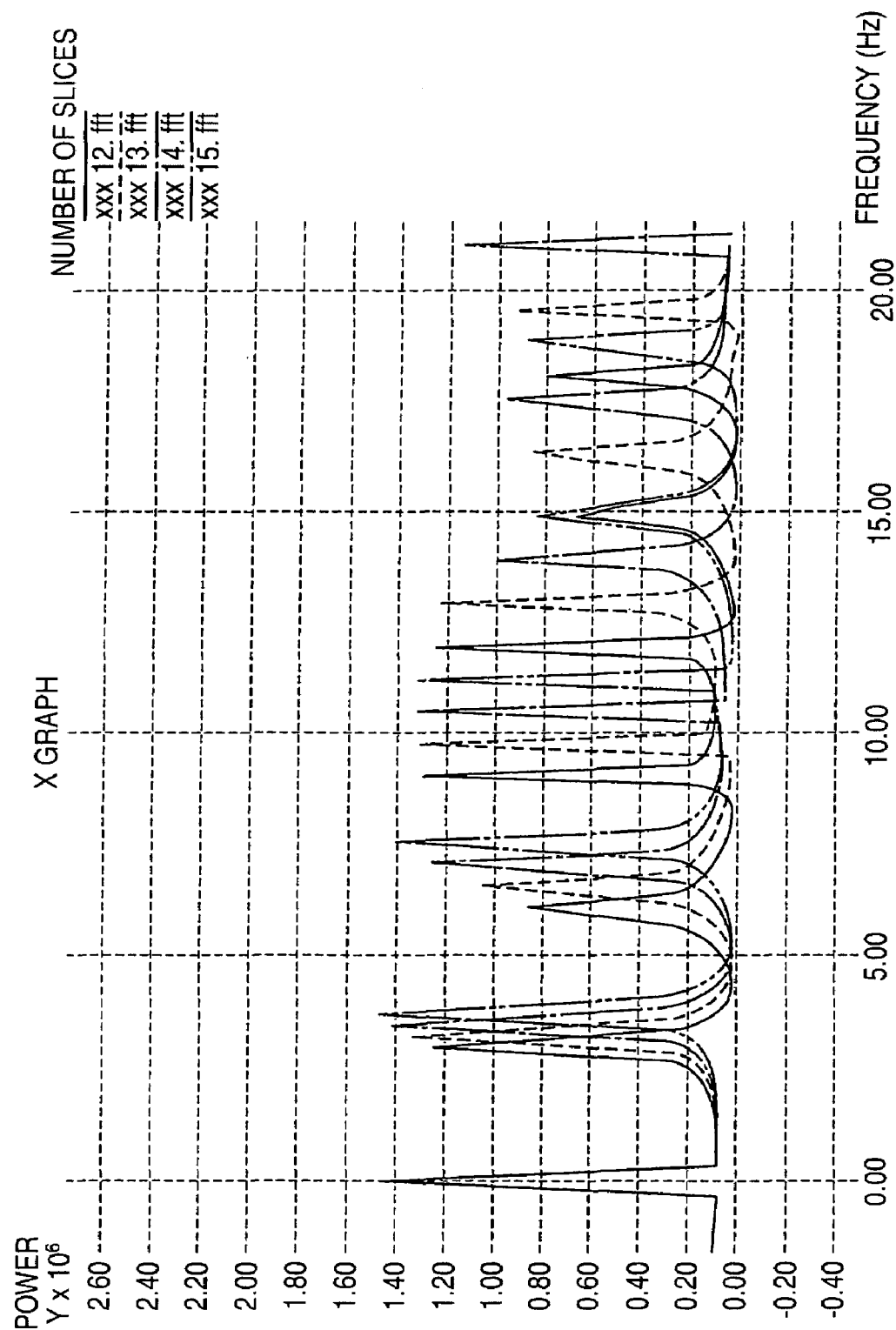
FIG. 6 is a graph showing a change in a frequency characteristic of an input power spectrum concerning the X-axis direction at the time when the number of slices is changed.

Incidentally, FIG. 5 is a graph showing an example of a pulse sequence for controlling a gradient magnetic field in the X-axis direction. The pulse sequence shown in FIG. 5 is an FSE sequence with echo intervals of 20 ms at the time when repetition time (TR) is set to 4000 ms and the number of slices is set to fifteen. FIG. 6 shows a result of calculating input power spectra concerning the X-axis direction at the time when only the number of slices is changed to fourteen, thirteen, and twelve other than fifteen, respectively, under such conditions.

It is seen from FIG. 6 that a frequency, at which input power is large, changes by changing the number of slices. Therefore, it is possible to change frequency characteristics of oscillation of the magnetic resonance imaging apparatus following an imaging operation, that is, oscillation following a dynamic load.

Figure 7:
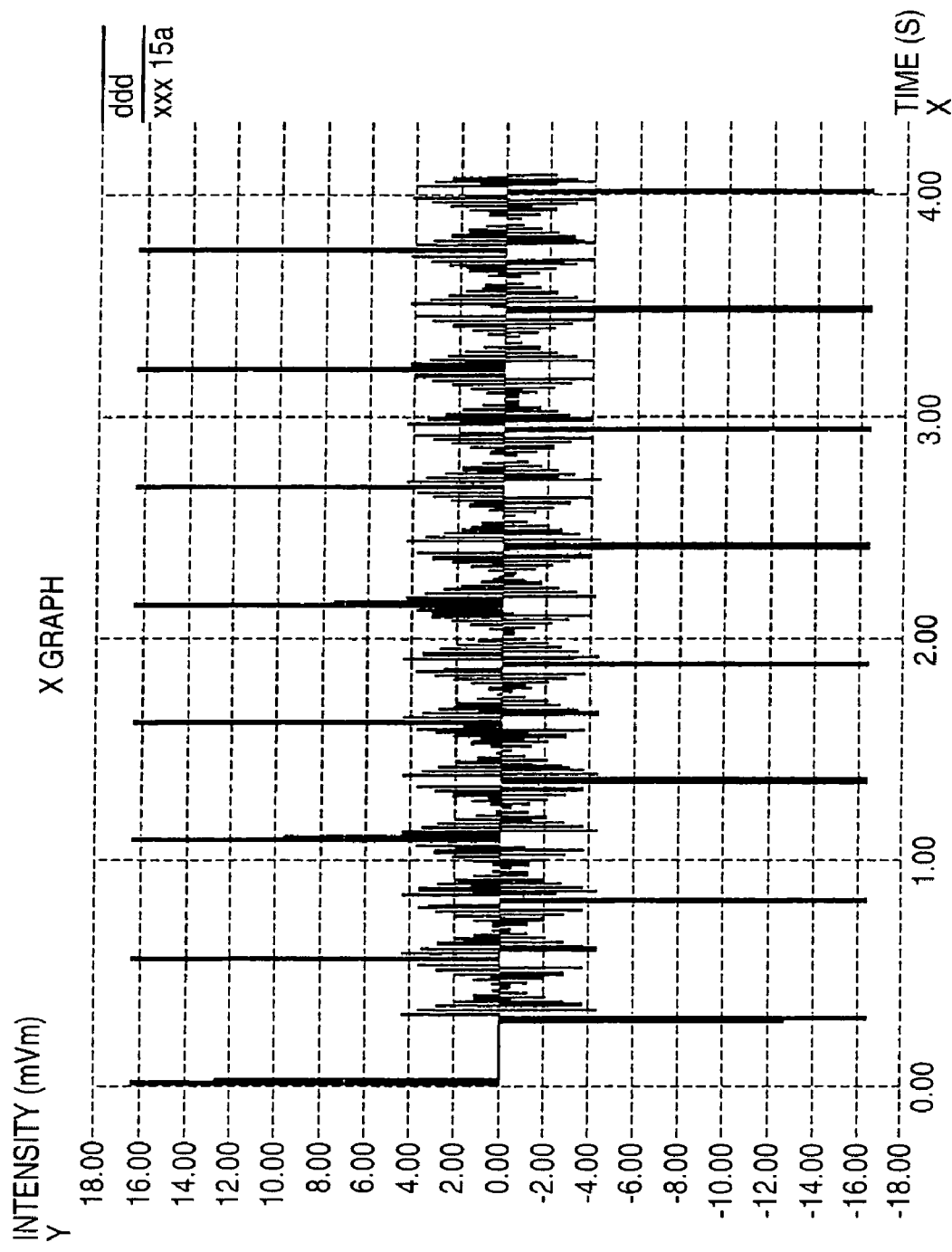
FIG. 7 is a graph showing a pulse sequence obtained by changing the pulse sequence shown in FIG. 5 so as to invert a polarity for each slice.

FIG. 7 is a graph showing a pulse sequence obtained by changing the pulse sequence shown in FIG. 5 so as to invert a polarity for each slice. FIG. 8 shows a result of calculating input power spectra concerning the X-axis direction at the time when the pulse sequence shown in FIG. 5 is applied and at the time when the pulse sequence shown in FIG. 7 is applied, respectively.

It is seen from FIG. 8 that a frequency, at which input power is large, changes by switching a pulse sequence for which a polarity is not inverted and a pulse sequence for which a polarity is inverted. Therefore, it is possible to change frequency characteristics of oscillation following a dynamic load by changing an already-set pulse sequence to another pulse sequence.

Thus, in step ST5, among the types of sequences or the imaging parameters that are already set, an element, which can change frequency characteristics of oscillation following a dynamic load as described above, is changed. Note that, as the element to be changed, any one of the elements may be set fixedly or an element may be selected by a user. In addition, an element decided in advance may be changed automatically by the control unit 107 or may be changed according to an instruction by a user.

Specifically, it is seen with reference to FIG. 6 that an input spectrum is large near 11 Hz in the case of fifteen slices. In the case of the magnetic resonance imaging apparatus in which the supporting method B in FIG. 2 is adopted, since a resonance point is near 11 Hz, it is highly likely that resonance is caused when the number of slices is set to fifteen in the case of the FSE described above. Large oscillation power is calculated in step ST3. Thus, the number of slices is changed in such a case.

When the types of sequences or the imaging parameters have been changed in this way, the control unit 107 repeats the processing of step ST2 and the subsequent steps. Consequently, the types of sequences or the imaging parameters are changed until all the oscillation powers in the axial directions calculated in step ST3 fall to be less than the threshold value decided in advance. Then, when it is judged in step ST4 that the oscillation power is not larger than the threshold value, the control unit 107 proceeds from step ST4 to step ST6.

In step ST6, with the setting function, the control unit 107 determines the types of sequences and the imaging parameters set at this point as conditions used in actual imaging. Then, the control unit 107 shifts to imaging processing under the determined conditions.

As described above, according to this embodiment, it is possible to avoid imaging under conditions in which resonance is caused. Therefore, it is possible to reduce deterioration in an image quality and an unpleasant feeling of a patient due to oscillation. In particular, in this embodiment, imaging conditions are set such that resonance is not caused in all the axial directions of X, Y, and Z. Thus, it is possible to prevent oscillation of the magnetic resonance imaging apparatus satisfactorily. However, depending on a structure of the magnetic resonance imaging apparatus, resonance is hardly caused under any imaging conditions in a specific axial direction or, even if resonance is caused in a specific axial direction, power of the resonance is small and large oscillation is not caused. In such a case, it is also possible that the processing for avoiding resonance in the specific axial direction is not performed and the processing described above is performed for one axial direction or two axial directions.

Various modification of this embodiment are possible as described below.

It is also possible that information indicating a frequency value of a natural frequency is stored in the storing unit 104 instead of the input spectrum information and, in step ST4, the control unit 107 judges whether power of the natural frequency in the frequency characteristics obtained in step ST2 is equal to or larger than the threshold value. In this case, step ST3 is not performed.

It is also possible to change frequency characteristics of oscillation following a dynamic load by setting repetition time (TR) long without changing the number of slices to reduce the number of slices per unit time. Alternatively, when a frequency of oscillation unavoidably overlaps a natural frequency, it is possible to avoid resonance by finding a gradient magnetic field, which is outputted at repetition overlapping a natural period, and decreasing intensity of the gradient magnetic field in a range in which imaging is not hindered to reduce a component near the natural frequency. Therefore, an element of imaging conditions to be changed may be other elements such as the repetition time and the intensity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a gradient magnetic unit that generates a gradient magnetic field;
   an obtention unit that obtains data defining natural resonant mechanical oscillation characteristics of the magnetic resonance imaging apparatus caused by changes in the gradient magnetic field while imaging plural slices; and
   a judgment unit that judges whether sympathetic mechanical vibration generated by interaction between rapidly changing magnetic Lorentz forces acting on MRI gradient coils of the magnetic resonance imaging apparatus is likely to occur for a proposed MRI data acquisition sequence prior to its being used based on the obtained oscillation characteristics.

2. The magnetic resonance imaging apparatus of claim 1, further comprising:
   a memory unit that stores natural mechanical oscillation information corresponding to natural mechanical oscillation of the magnetic resonance imaging apparatus,
   wherein the judgment unit judges whether sympathetic mechanical vibration is likely to occur based on the obtained oscillation characteristic and the natural oscillation information.

3. The magnetic resonance imaging apparatus of claim 1, wherein:
   the judgment unit judges whether the sympathetic vibration is likely to occur based on whether expected oscillation due to sympathetic mechanical vibration is equal to or larger than a threshold value.

4. The magnetic resonance imaging apparatus of claim 1, further comprising:
   a setting unit that sets imaging conditions,
   wherein the obtention unit obtains the oscillation characteristic based on the set imaging conditions.

5. The magnetic resonance imaging apparatus of claim 4, wherein:
   the setting unit changes the proposed imaging conditions when it is judged by the judgment unit that excess sympathetic mechanical vibration is likely to occur and accepts the proposed imaging conditions for use in imaging when it is judged that excess sympathetic vibration is not likely to occur.

6. The magnetic resonance imaging apparatus of claim 4, wherein the setting unit changes a number of slices to be imaged per unit time when the imaging conditions are changed.

7. The magnetic resonance imaging apparatus of claim 4, wherein the setting unit alters a sequence of the changing gradient magnetic field when the imaging conditions are changed.

8. The magnetic resonance imaging apparatus of claim 4, wherein:
   the setting unit sets the imaging condition for use in imaging when it is judged by the judgment means that excess sympathetic mechanical vibration is not likely to occur.

9. The magnetic resonance imaging apparatus of claim 4, wherein:
   the setting unit sets an FSE pulse sequence.

10. The magnetic resonance imaging apparatus of claim 1, wherein:
    the gradient magnetic unit generates gradient magnetic fields in two orthogonal axis directions respectively; and
    the obtention unit obtains separate oscillation characteristics corresponding to each of the two directions.

11. The magnetic resonance imaging apparatus of claim 10, wherein:
    the memory unit stores natural oscillation information corresponding to natural mechanical oscillations the magnetic resonance imaging apparatus has along the two axis directions respectively, and
    the judgment unit judges whether the sympathetic vibration is likely to occur based on the oscillation characteristics and the natural oscillation information in said two axis directions.

12. The magnetic resonance imaging apparatus of claim 10, wherein:
    the judgment unit judges whether sympathetic mechanical vibration is likely to occur based on whether the sympathetic vibration likely to be caused in the two directions respectively, is equal to or larger than corresponding threshold values.

13. The magnetic resonance imaging apparatus according to claim 10, wherein:
    the gradient unit generates a third gradient magnetic field along a third axial direction orthogonal to each of the two axis directions;
    the obtention unit obtains an oscillation characteristic corresponding to the third axis direction of the magnetic resonance imagine apparatus according to a change of the gradient magnetic field in the third axis direction when plural slices are imaged; and
    the judgment unit judges whether sympathetic vibration occur based on the natural oscillation of the magnetic resonance imaging apparatus along the third axial direction and the obtained oscillation characteristic.

14. The magnetic resonance imaging apparatus of claim 10, further comprising:
    a setting unit that sets imaging conditions,
    wherein the obtention unit estimates mechanical oscillation characteristics taking into account changes over the time for imaging plural slices of the gradient magnetic fields that are likely to be caused by imaging under the set imaging conditions.

15. The magnetic resonance imaging apparatus of claim 14, wherein:
    the setting unit changes the imaging conditions when it is judged that excess sympathetic mechanical vibration is likely to occur in at least one axis direction among the two axis directions, and the setting unit does not change the imaging conditions when it is judged that excess sympathetic mechanical vibration is not likely to occur in each axis direction.

16. The magnetic resonance imaging apparatus of claim 14, wherein:
the setting unit changes a number of slices to be imaged per unit time when the imaging condition is changed.

17. The magnetic resonance imaging apparatus of claim 14, wherein:
the setting unit changes a sequence of changing gradient magnetic fields in an axis direction where it is judged that excess sympathetic mechanical vibration is likely to occur if the imaging conditions are changed.

18. The magnetic resonance imaging apparatus of claim 1, further comprising:
a presentation unit for presenting to an operator an imaging condition where excess sympathetic mechanical vibration is not likely to occur when it is judged by the judgment unit that excess sympathetic mechanical vibration is likely to otherwise occur.

19. The magnetic resonance imaging apparatus of claim 1, wherein:
the obtention unit obtains the mechanical oscillation characteristic of the magnetic resonance imaging apparatus caused by changes of the gradient magnetic field while imaging a number of slices.

20. A magnetic resonance imaging apparatus, comprising:
a gradient magnetic generation means for generating a gradient magnetic field;
an obtention means for obtaining data defining natural resonant mechanical oscillation characteristics of the magnetic resonance imaging apparatus caused by changes of the gradient magnetic field while imaging plural slices; and
a judgment means for judging whether sympathetic mechanical vibration generated by interaction between rapidly changing magnetic Lorentz forces acting on MRI gradient coils of the magnetic resonance imaging apparatus is likely for a proposed MRI data acquisition sequence prior to its being used based on the obtained oscillation characteristics.

21. A method of controlling a magnetic resonance imaging apparatus, said method comprising:
obtaining data defining natural resonant mechanical oscillation characteristics of an magnetic resonance imaging apparatus caused by changes of a gradient magnetic field while imaging plural slices; and
judging whether excess sympathetic mechanical vibration generated by interaction between rapidly changing magnetic Lorentz forces acting on MRI gradient coils of the magnetic resonance imaging apparatus is likely to occur for a proposed MRI data acquisition sequence prior to its being used based on the obtained oscillation characteristic;
modifying the proposed MRI data acquisition sequence if excess sympathetic mechanical vibration is likely to occur; and
usinq the modified MRI data acquisition sequence to produce an image.

* * * * *